(12) United States Patent
Matsuse

(10) Patent No.: US 9,222,197 B2
(45) Date of Patent: Dec. 29, 2015

(54) SHIELD MEMBER AND APPARATUS FOR GROWING SINGLE CRYSTAL EQUIPPED WITH THE SAME

(75) Inventor: Akihiro Matsuse, Nagoya (JP)

(73) Assignee: SHOWA DENKO K.K., Tokyo (JP)

( * ) Notice: Subject to any disclaimer, the term of this patent is extended or adjusted under 35 U.S.C. 154(b) by 631 days.

(21) Appl. No.: 13/580,877

(22) PCT Filed: Jan. 12, 2011

(86) PCT No.: PCT/JP2011/050341
§ 371 (c)(1),
(2), (4) Date: Aug. 23, 2012

(87) PCT Pub. No.: WO2011/105123
PCT Pub. Date: Sep. 1, 2011

(65) Prior Publication Data
US 2012/0318198 A1 Dec. 20, 2012

(30) Foreign Application Priority Data
Feb. 26, 2010 (JP) .................................. 2010-043310

(51) Int. Cl.
*C30B 23/06* (2006.01)
*C30B 29/36* (2006.01)
*C30B 23/00* (2006.01)

(52) U.S. Cl.
CPC ............... *C30B 23/06* (2013.01); *C30B 29/36* (2013.01); *C30B 23/002* (2013.01); *C30B 23/005* (2013.01); *Y10T 117/10* (2013.01)

(58) Field of Classification Search
CPC ........ Y10T 117/10; C30B 23/06; C30B 29/36
See application file for complete search history.

(56) References Cited

U.S. PATENT DOCUMENTS 6,193,797 B1 * 2/2001 Shiomi et al. .................... 117/88
6,336,971 B1 * 1/2002 Nagato et al. ................. 117/109
(Continued)

FOREIGN PATENT DOCUMENTS

JP  8-295595 A  11/1996
JP  4089073 B2  5/2008
(Continued)

OTHER PUBLICATIONS

Office Action dated Apr. 25, 2014, issued by the Japan Patent Office in corresponding Japanese Application No. 2010-043310.
(Continued)

*Primary Examiner* — Michael Kornakov
*Assistant Examiner* — Hua Qi
(74) *Attorney, Agent, or Firm* — Sughrue Mion, PLLC

(57) ABSTRACT

Provided is a shield member and an apparatus for growing a single crystal equipped with the shield member. Such a shield member includes: a vessel for growing the single crystal; a raw material storage part positioned at a lower portion of the vessel for growing the single crystal; a substrate supporting part, positioned above the raw material storage part to support the substrate; and a heating apparatus positioned at a an outer periphery of the vessel for growing the single crystal, thereby sublimating the raw material from the raw material storage part to grow the single crystal of the raw material onto the substrate, in which a plurality of permeation holes through which the raw material gas passes is formed. The shield member is configured such that the heat capacity thereof increases from the center to the outer periphery.

11 Claims, 9 Drawing Sheets

(56) References Cited

U.S. PATENT DOCUMENTS

2006/0254505 A1* 11/2006 Tsvetkov et al. ............. 117/104
2011/0107961 A1* 5/2011 Motoyama et al. ............. 117/84

FOREIGN PATENT DOCUMENTS

| JP | 2008-540316 A | | 11/2008 | |
|----|----|----|----|----|
| JP | 4199921 B2 | | 12/2008 | |
| JP | 2009-274930 A | | 11/2009 | |
| JP | 2009274930 A | * | 11/2009 | .............. C30B 23/02 |
| JP | 2009-280463 A | | 12/2009 | |
| JP | 2010-013296 A | | 1/2010 | |
| JP | 2010024117 A | | 2/2010 | |
| WO | 99/14405 A1 | | 3/1999 | |
| WO | 00/39372 A1 | | 7/2000 | |
| WO | 2009/139447 A1 | | 11/2009 | |

OTHER PUBLICATIONS

International Search Report for PCT/JP2011/050341 dated Feb. 15, 2011.
Communication dated Sep. 29, 2015 from the Japanese Patent Office in counterpart application No. 2014-249172.

* cited by examiner

PRIOR ART

PRIOR ART

PRIOR ART

US 9,222,197 B2

SHIELD MEMBER AND APPARATUS FOR GROWING SINGLE CRYSTAL EQUIPPED WITH THE SAME

CROSS REFERENCE TO RELATED APPLICATIONS

This application is a National Stage of International Application No. PCT/JP2011/050341 filed on Jan. 12, 2011, which claims priority from Japanese Patent Application No. 2010-043310, filed on Feb. 26, 2010, the contents of all of which are incorporated herein by reference in their entirety.

TECHNICAL FIELD

The present invention relates to a light-emitting diode, a method for manufacturing the same, and a light-emitting diode lamp.

BACKGROUND ART

Silicon carbide has excellent properties, such as a large thermal, dielectric breakdown voltage, a wide energy band gap, and a high thermal conductivity, and hence silicon carbide can be applied to a high-power power device, a high-temperature resistant semiconductor device, a radiation-resistant semiconductor device, and a high-frequency resistant semiconductor device. Since the progress in performance of silicon is reaching its margin due to the physical property limit of the material itself, silicon carbide has been attracting attention, in which it is possible to take physical property limit larger than silicon. In recent years, as energy saving technology that reduces the energy loss during power conversion to be a measure against global warming, power electronics technology using silicon carbide material has attracted the expectation. As the basic technology, the research and development of the growing technology of silicon carbide single crystal is energetically proceeded, the establishment of large diameter technology is urgently required in terms of reducing manufacturing costs for the promotion of commercialization.

As a method for growing a silicon carbide single crystal, a method using the reaction of silicon vapor with carbon to make a silicon carbide single crystal grow on the seed crystal of a silicon carbide has been known. For example, Patent Document 1 discloses a method for growing silicon carbide single crystal onto a seed crystal substrate, which comprises elevating vaporized gas from silicon material, making the gas pass through porous carbon material or through-hole perforated carbon material which is arranged above the silicon material and heated at a temperature higher than the temperature of the silicon material and the temperature of silicon carbide single crystal seed crystal substrate and 1600° C. or higher, to reach the seed crystal substrate disposed above the carbon material, thereby growing silicon carbide single crystal onto the seed crystal substrate. The method of Patent Document 1 is intended to place a carbon material having pores between the seed crystal substrate and carbon material, to use the carbon material for supplying carbon raw material for silicon carbide single crystal.

In addition, a sublimation recrystallization method is known as another growing method. In this method, a single crystal silicon carbide as a raw material is sublimated in a crystal growing vessel to recrystallize silicon carbide on a seed crystal substrate at a low temperature (for example, Patent Documents 2 and 3).

FIG. 7 shows an example of a conventional single crystal growing apparatus having a cylindrical container for producing a silicon carbide single crystal.

Hitherto, the single crystal growing apparatus 100 used in producing a single crystal silicon carbide by sublimation recrystallization method, as shown in FIG. 7, is equipped with the raw material storage unit 102 located at a lower portion of the container 101 for crystal growth, the substrate supporting part 104 supporting the seed crystal 103 with the circular substrate supporting plate arranged at above the raw material storage unit 102, and the heating device 105 arranged at outer periphery of the container 101 for crystal growth, in which a circular shielding plate 106 having a thickness of approximately 10 mm is arranged between the seed crystal 103 and the raw material storage unit 102 in order to provide temperature difference between the seed crystal 103 and the raw material storage unit 102 (for example, Patent Document 4). Since the raw material 107 in the container for crystal growth is heated from the outer peripheral side, the heated raw material has a temperature distribution in which the temperature of the outer peripheral side is higher than that of the center portion.

Therefore, in the absence the shielding plate 106, radiant heat is emitted from the raw material surface to the seed crystal directly, corresponds to the temperature distribution, whereas in the presence of the shielding plate 106, the shielding plate 106 receives the radiant heat from the raw material to be heated, and emits the radiant heat to the seed crystal or the growing crystal. Therefore, it is believed that the temperature distribution in the radial direction of the raw material is relaxed by the shielding plate 106, and then the seed crystal or the growing crystal is heated.

Patent Document

[Patent Document 1]: Pat No. 4199921
[Patent Document 2] International Publication No. 2000/39372
[Patent Document 3] Patent Publication No. 2010-13296
[Patent Document 4] Patent Publication No. 8-295595
[Patent Document 5] Pat No. 4089073

SUMMARY OF THE INVENTION

Problems to be solved by the Invention

However, the shielding plate 106 is not only heated by the radiant heat of high temperature raw material but also is heated from the outer peripheral side to the center by direct heating equipment. Therefore, there is a non-uniform surface temperature in the radial direction of the shielding plate 106 itself, the surface temperature of the seed crystal 103 or growing crystal becomes non-uniform in the radial direction, correspondingly thereto. As a result, silicon carbide cannot grow at a flat growing surface, such that crack and dislocation generate due to thermal stress, thereby it is difficult to obtain a crystal having a high quality and a large diameter. Also, as crystal grows, the temperature distribution in the radial direction of the crystal changes to generate thermal stress within the crystal, leading to deterioration of crystal quality.

Patent Document 5 has been proposed a constitution of the shield plate aiming to equalize the temperature of the upper surface of the shield plate, however, the effect on uniforming the surface temperature of the seed crystal or the growing crystal by the shielding plate has not been shown, and also, the influence of the heating device arranged on the outer periphery of the container for crystal growth has not been considered.

Although, the temperature distribution in the surface and in the vicinity of the surface of the seed crystal and the growing crystal is an important parameter that affects the growth of single crystal, the interior of the vessel for growing crystal upon growing the single crystal is heated at a high temperature of approximately 2000° C., and hence measuring actually the temperature distribution is very difficult. Therefore, when designing the furnace structure or constitution of heating system to realize the optimum temperature distribution including the temperature distribution of the surface and in the vicinity thereof of the seed crystal and the growing crystal, the temperature distribution analysis using simulation has played an important role. That is, a method of designing a furnace structure based on the findings obtained from the simulation, actually growing the single crystal by the structure to confirm the effect, in addition, performing fine tuning of the structure to find the optimum structure has been adopted.

In order to avoid unnecessary trial and error, the simulation is indispensable in the future, and it is thought that the enlargement of diameter in the future progresses with making the most use of the simulator to avoid unnecessary trial and error.

Shown in FIGS. 8A and 8B is the simulation result of (° C.) temperature distribution in the interior of the vessel for growing crystal, which is made of graphite, for producing silicon carbide single crystal using silicon carbide seed crystal.

The simulation was performed using the software "Virtual Reactor" manufactured by Temperature Distribution Analysis of STR-Group Ltd.

FIG. 8A shows the case there is no shield plate, whereas FIG. 8B shows the case there is a conventional shield plate which is made of graphite.

An example of the shielding plate shown in FIG. 8B consists of a plurality of ring members, each of which has an inner diameter different from each other, rectangular cross section, 8 mm in width, and 24 mm in thick, and arranged toward the end from the center so as not to overlap to each other. Each of adjoining ring members is arranged 2 mm apart from each other, and the constitution that sublimated gas of the raw material passes through the gap therebetween is imaged. It should be noted that the isothermal lines of the temperature are shown at intervals of 5° C.

It can be seen that in the case of no shielding plate (in FIG. 8A), the temperature distribution in the radial direction of the raw material is large, and that (on the periphery) there is a difference of at most approximately 50° C. between the central portion and the peripheral portion (outer periphery).

In addition, although it is preferable that the temperature distribution of the surface and in the vicinity thereof of the substrate (seed crystal) is flat, it can be seen that it has become a temperature distribution having a large gradient to the substrate surface.

It can be seen that in the presence of the shielding plate (in FIG. 8B), that the temperature distribution in the radial direction of the raw material has been greatly reduced, compared to the case of no shielding plate. That is, as for the lower side of the shielding plate, the effect of reducing the temperature distribution in the radial direction is large in the conventional shielding plate. This is as has been previously recognized.

However, it can be seen that as for the upper side of the shield plate, in particular, as for the surface and in the vicinity thereof of the substrate (seed crystal), the effect of reducing temperature distribution in the radial direction does not appear. In this case, since the shield plate does not affect the thermal radiation from the vessel wall, in the temperature distribution on the upper side of the shield plate, the influence from the thermal radiation from the wall of the vessel for growing crystal has remained as it is, and hence it can be thought that it is because the peripheral portion is heated harder than the center portion in the surface of the substrate (seed crystal) by the thermal radiation from the vessel wall.

That is, the surface of the substrate (seed crystal) receives both heating by thermal radiation from the raw material and the heating by thermal radiation from the vessel wall. Non-uniformity in heating by thermal radiation from the raw material having a large thermal distribution in the radical direction can be shielded by the conventional shielding plate, whereas non-uniformity in heating by thermal radiation from the vessel wall cannot be controlled by the conventional shielding plate.

The present invention was made in view of the above circumstances, it is an object of the present invention to provide a shield member and an apparatus for growing single crystal equipped with the shield member, which has significant effect of unifying the surface temperature in the radical direction of the seed crystal and growing crystal, while maintaining the effect of a conventional shielding plate, and enables to produce a single crystal with high quality and a large size.

DISCLOSURE OF INVENTION

Means for Solving the Problems

The inventors of the present invention have intensively studied to achieve the above object, and as a result, they conceived of a revolutionary idea of correcting the non-uniform heating of the substrate surface by thermal radiation from the wall of the vessel for growing crystal, not only simply shielding the non-uniform heating by thermal radiation from the raw material having a large temperature distribution in the radial direction, using a conventional shielding plate, thereby completing the present invention.

That is, as mentioned above, the heating by thermal radiation from the wall of the vessel for growing a crystal is to heat the peripheral portion of the substrate (seed crystal) harder than the center portion of the substrate (seed crystal), and hence, in order to correct such non-uniform heating, the thermal radiation by the shielding plate or shield member should be configured so as to heat the center portion of the substrate (seed crystal) harder than the peripheral portion of the substrate (seed crystal). More specifically, it is reached to configure such that the center portion of the shielding plate or shield member is likely to be heated at a temperature which is higher than the peripheral portion of the shielding plate or shield member, because the shielding plate or shield member receives the radiation heat from the raw material and the vessel for growing crystal to emit the radiation heat corresponding to the temperature thereof.

(1) In order to solve the above problems, the present invention provides the following means: a shield member placed between a raw material storage part and a substrate supporting part in an apparatus for growing a single crystal, comprising: a vessel for growing a crystal; a raw material storage part positioned at a lower portion of the vessel for growing a crystal; a substrate supporting part, positioned above the raw material storage part so as to be opposed to the raw material storage part to support the substrate; and a heating apparatus positioned at outer periphery of the vessel for growing a crystal, thereby sublimating the raw material from the raw material storage part to grow single crystal of the raw material onto the substrate, wherein a plurality of permeation holes through which the raw material gas passes is formed, and the shield member is configured such that the heat capacity thereof increases as displacing from the center to the outer periphery.

(2) The shield member as set forth in (1) above, wherein the shield member is configured so as to increase the thickness thereof as displacing from the center to the outer periphery, such that the heat capacity thereof increases as displacing from the center to the outer periphery.

(3) The shield member as set forth in (2) above, wherein the ratio of the maximum thickness ($d_{max}$) and the minimum thickness ($d_{min}$) of the shield member ($d_{max}/d_{min}$) ranges from 3 to 50.

(4) The shield member as set forth in (1) above, wherein the shield member consists of a plurality of ring members each of which has an opening with a different inner diameter and different specific heat capacity, and the shield member is configured such that the heat capacity thereof increases as displacing from the center to the outer periphery, by arranging the ring member with a larger specific heat capacity as displacing from the center to the outer periphery.

(5) The shield member as set forth in any one of (1) to (4) above, wherein the surface of the shield member on the side of the substrate supporting part is flat.

(6) The shield member as set forth in any one of (1) to (5) above, wherein the shield member has an opening ratio of center side (total area of the opening of the permeation hole/total area of the portion other than the permeation hole) which is larger than an opening ratio of peripheral edge side.

(7) The shield member as set forth in any one of (1) to (6) above, wherein each of the plurality of ring members having a different thickness and a different opening inner diameter is arranged such that thicker ring member is placed sequentially as displacing from the center to the outer periphery, so as not to overlap with each other in plan view.

(8) The shield member as set forth in any one of (1) to (6) above, wherein the shield member consists of a plurality of ring members having the same thickness and different opening inner diameter arranged to be overlapped with each other, such that the number of ring members which overlap increases as displacing from the center to the outer periphery.

(9) The shield member as set forth in any one of (1) to (8) above, wherein the shield member is made of carbon material.

(10) The shield member as set forth in any one of (1) to (9) above, wherein the shield member is made of a porous material.

(11) An apparatus for growing a single crystal, comprising: a vessel for growing a crystal; a raw material storage part positioned at a lower portion of the vessel for growing a crystal; a substrate supporting part, positioned above the raw material storage part so as to be opposed to the raw material storage part to support the substrate; and a heating apparatus positioned at outer periphery of the vessel for growing a crystal, thereby sublimating the raw material from the raw material storage part to grow single crystal of the raw material onto the substrate, wherein the shield member as set forth in any one of (1) to (10) above is provided between the raw material storage part and the substrate supporting part.

(12) The apparatus for growing a single crystal as set forth in (11) above, wherein the outer periphery of the shield member is supported by the inner wall of the vessel for growing crystal.

(13) The apparatus for growing a single crystal as set forth in (11) above, wherein the shield member is supported by a supporting member elongated from the bottom of the vessel for growing crystal.

(14) The apparatus for growing a single crystal as set forth in any one of (11) to (13) above, wherein the single crystal is a single crystal of silicon carbide.

In the shield member of the present invention, the "permeation hole" through which the raw material gas permeates includes all of holes and opening through which the gas permeates, for example, when the shield member consists of ring member, the "permeation hole" includes the "opening" the ring member has, and when the shield member consists of a plurality of ring members, the "permeation hole" includes the gap between adjoining the ring members. In addition, when the shield member consists of porous material, the "permeation hole" through which the raw material gas permeates includes the pores in the porous material, and hence, in this case, the "permeation hole" through which the raw material gas permeates may be either the pores only of the porous material, or both the pores of the porous material and the pores which are formed separately from the pores of the porous material. It means the same meaning, in the definition of the "opening rate" in the shield member of the present invention, i.e. "total area of the opening of the permeation hole/total area of the portion other than the permeation hole".

In the shield member of the present invention, the configuration such that the heat capacity thereof increases as displacing from the center to the outer periphery may be either continuously increase or stepwisely increase.

In the case in which the shield member of the present invention consists of a plurality of members, each of the member may be either simply overlapped with each other, or joined with each other by a well known method. In addition, it may have a coupling part for coupling those members.

The ring member constituting the shield member of the present invention is not limited to those having circular cross section, may be those having rectangular cross section.

In the case in which the shield member of the present invention consists of a plurality of ring members, as to the ring member to be placed in the center portion, which may be referred to as "a ring member", even if there is no opening at the center.

Effect of the Invention

According to the shield member of the present invention, it is configured such that the heat capacity thereof increases as displacing from the center to the outer periphery, and as a result, the uniformity of the temperature in the radial direction of the seed crystal and the growing crystal is improved, thereby it is possible to produce a single crystal having a high quality and a large dimension, while maintaining a flat growing surface.

According to the apparatus for growing a single crystal of the present invention, since crystal growing is conducted in the state that the uniformity of the surface temperature of the seed crystal and the growing crystal in the radial direction is high, and hence it is possible to produce a single crystal having a high quality and a large dimension.

BEST MODE FOR CARRYING OUT THE INVENTION

A detailed explanation with respect to a shield member to which the present invention is applied, and an apparatus for growing a single crystal equipped with the shield member will be described below, with referring to drawings. It should be noted that the drawings used in the following description may show a magnified drawing of the characteristic portion for convenience sake, and hence the dimension ratio of each of constitutional elements may not be the same as in the real one.

[First Embodiment]

Figure 1A:
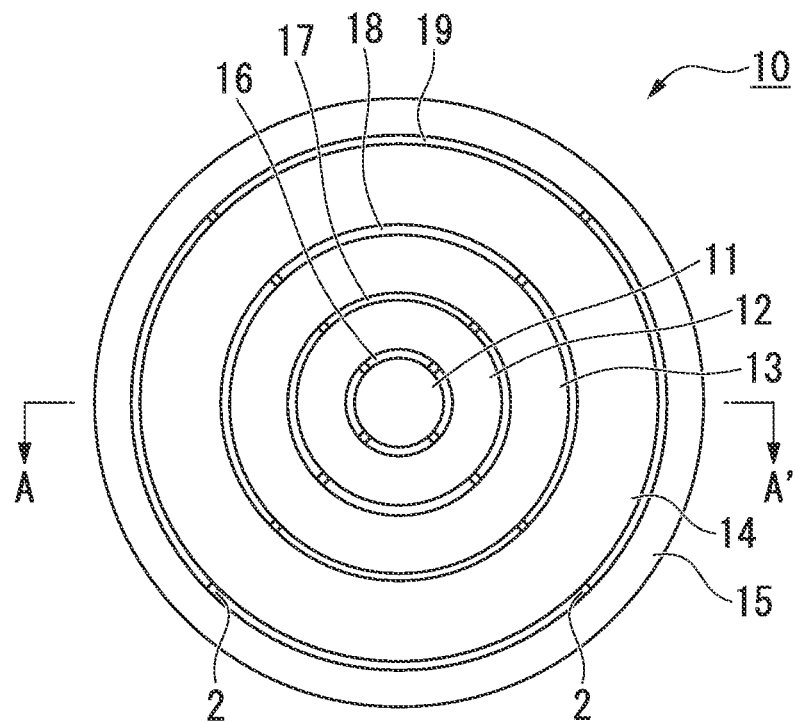
[FIG. 1A] A schematic plan view of the shield member of the first embodiment of the present invention.
Figure 1B:
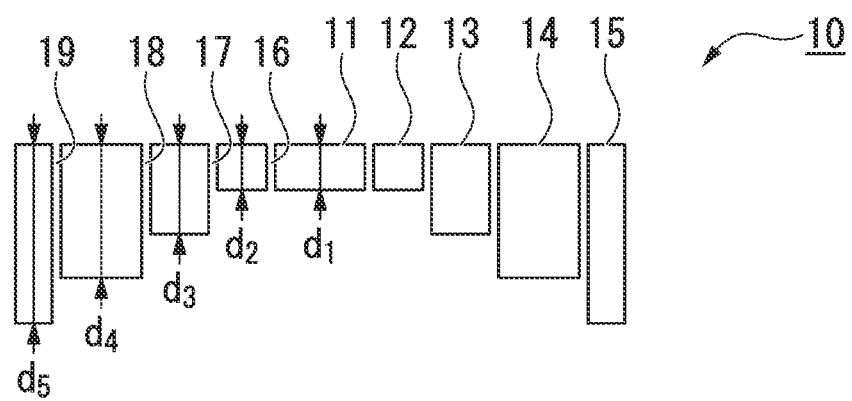
[FIG. 1B] A schematic cross-sectional view of the shield member of the first embodiment of the present invention.

In FIG. 1A, a schematic plan view of the shield member of the first embodiment of the present invention is shown, and in FIG. 1B, a schematic cross-sectional view taken along the line A-A' is shown.

The shield member 10 consists of five pieces of ring members 11, 12, 13, 14 and 15 made of silicon carbide having flat surface on the side facing the substrate supporting part, each of which has different thickness and opening having different inner diameter, and arranged in order of thickness from the thinnest at the center to the thickest toward the periphery so as not to overlap each other in a plan view (thickness of each member referred as d1, d2, d3, d4 and d5).

The thickness of each of the ring members is in the relationship of d1=d2<d3<d4 of <d5, the ring member 11 to be arranged at the center and the ring member 12 to be placed outside the ring member 11 have the same thickness, and the ring members 13, 14 and 15 following outside the ring member 12 are formed to be thicker in order. That is, the shield member 10 is configured so as to be thicker, as displaced from the center to the outer periphery, thereby configured such that the heat capacity becomes larger as displacing from the center to the outer periphery.

In the shield member 10, each of the gaps 16, 17, 18 and 19 between the adjoining ring members serves as the "permeation hole" through which the raw material gas passes.

In the shield member 10, the adjoining ring members are arranged apart from each other, and hence the sublimated gas of the raw material can pass through the gap (permeation hole) therebetween.

The shield member 10 is equipped with four connecting parts 2, in order to connect five pieces of ring members 11, 12, 13, 14 and 15.

EXAMPLE 1

Figure 2:
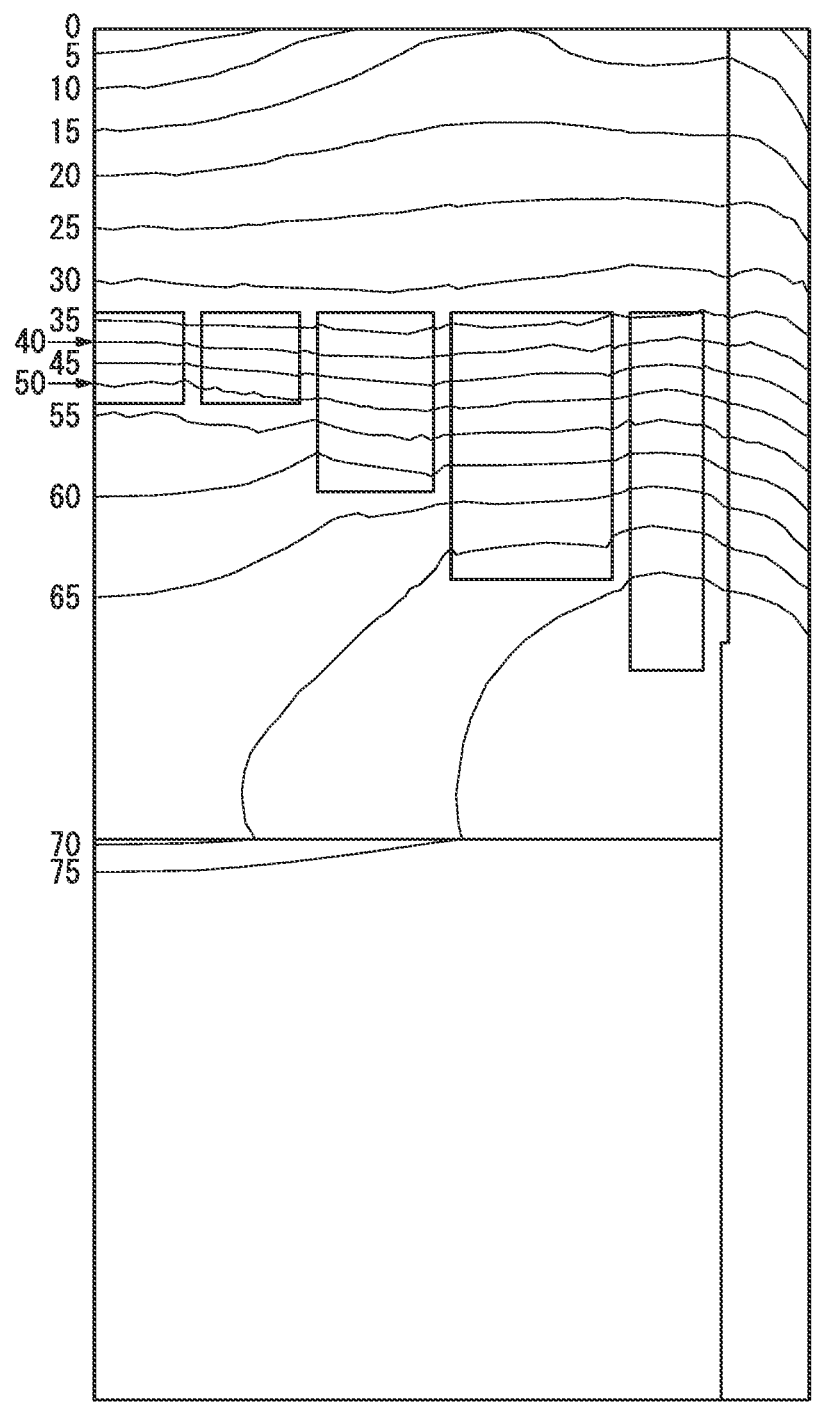
[FIG. 2] Results of simulation of temperature distribution in the vessel for growing a crystal of the apparatus for growing a single crystal using the shield member of the embodiment shown in FIGS. 1A and 1B.

FIG. 2 shows the simulation results of the temperature distribution in the vessel for growing a crystal of the apparatus for growing a single crystal using an example ("Example 1" below) of the shield member of the embodiment shown in FIGS. 1A and 1B.

Figure 8A:
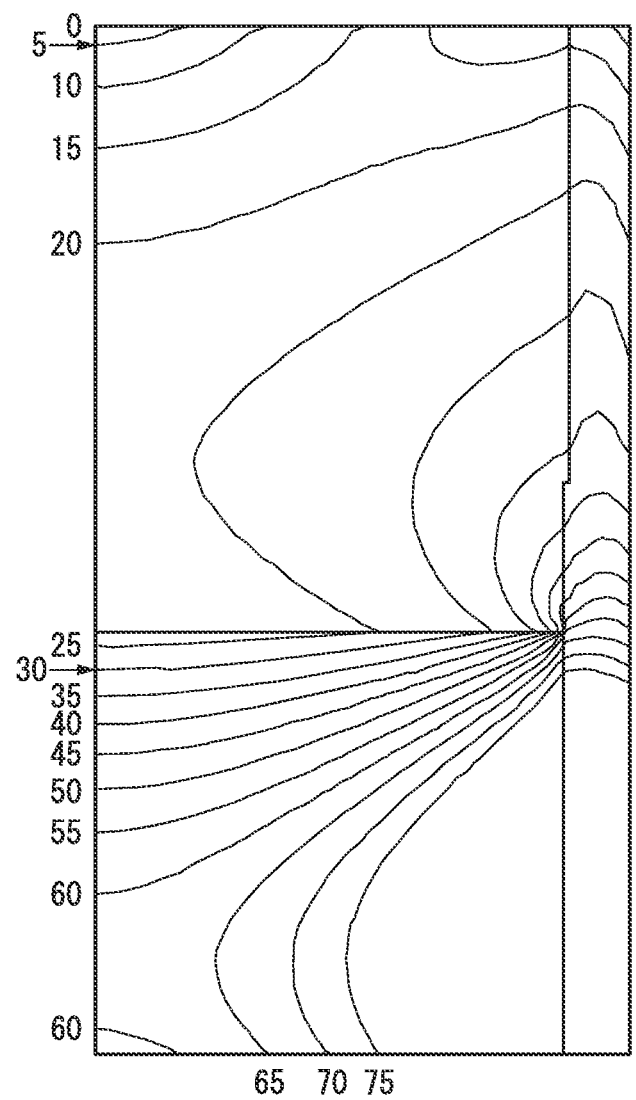
[FIG. 8A] Results of simulation of temperature distribution in the vessel for growing a crystal of a conventional single crystal growing apparatus.
Figure 8B:
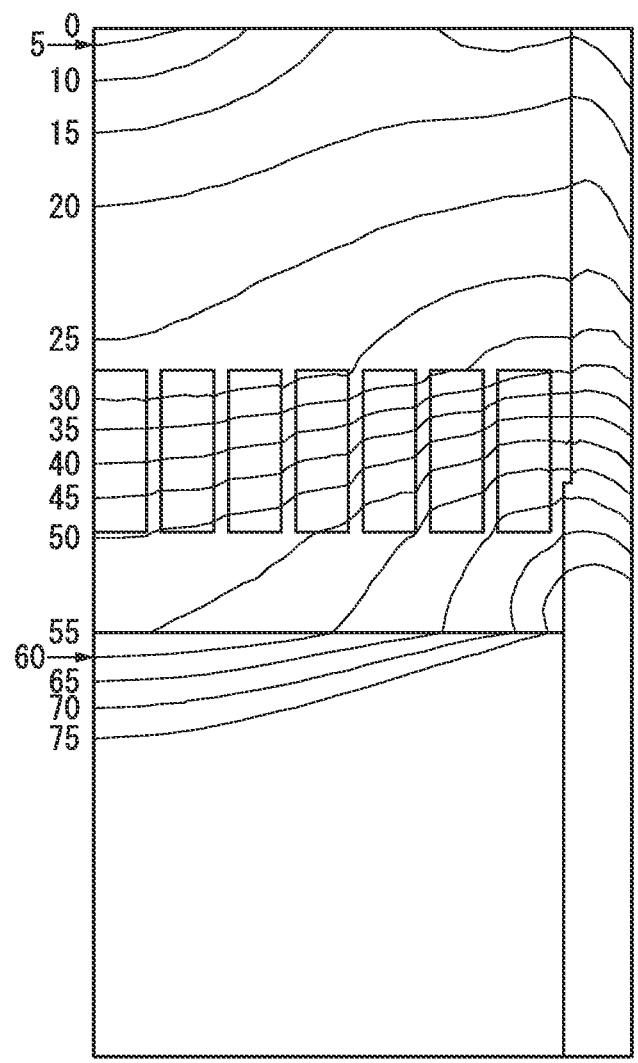
[FIG. 8B] Results of simulation of temperature distribution in the vessel for growing a crystal of a conventional single crystal growing apparatus.

As for the simulation, the same as in FIGS. 8A and 8B, the software "Virtual Reactor" Analysis of Temperature Distribution produced by STR-Group Ltd was used, and those same as in FIGS. 8A and 8B were used for the parameters other than the parameters regarding to the shield member.

The thickness of each of the ring members 11, 12, 13, 14 and 15, d1=d2, d3, d4 and d5 were set to be 10 mm, 20 mm, 30 mm and 40 mm, respectively. Therefore, the ratio of the maximum thickness (d5) and the minimum thickness (d1=d2), d5/d1 is 4.

The width of each of the ring members was 10 mm, 11 mm, 13 mm, 18 mm and 8 mm, in that order.

In addition, the distance between adjacent ring members was 2 mm in common.

From FIG. 2, it can be seen that the temperature distribution of the surface and the vicinity thereof of the substrate (seed crystal) has been significantly improved, In comparison with the case in the presence of the conventional shield plate shown in FIG. 8B.

Figure 3:
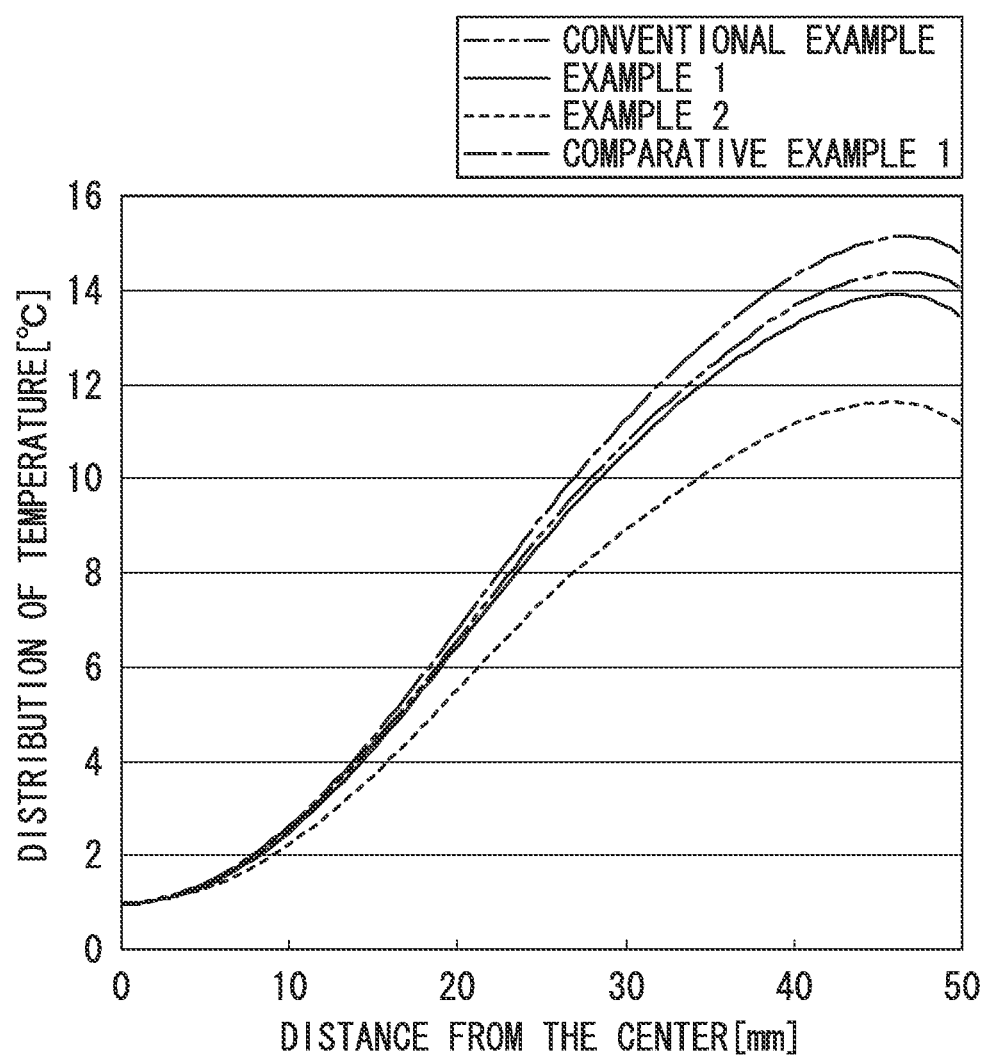
[FIG. 3] A graph showing the distribution of the surface temperature in the radial direction of the substrate by the simulation.

In FIG. 3, the distribution in the radial direction of the surface temperature (° C.) of the substrate (seed crystal) of the simulation of this example.

A case in which there is no shield plate is shown in FIGS. 8A and 8B and a case in which a conventional shield plate is used is also shown.

The difference in the temperature between the highest temperature (center) and the lowest temperature (periphery) is 12.9° C., and in the case of the conventional shield plate is 14.2° C. Hence, an improvement of 1.3° C. can be confirmed.

[Second Embodiment]

Figure 4A:
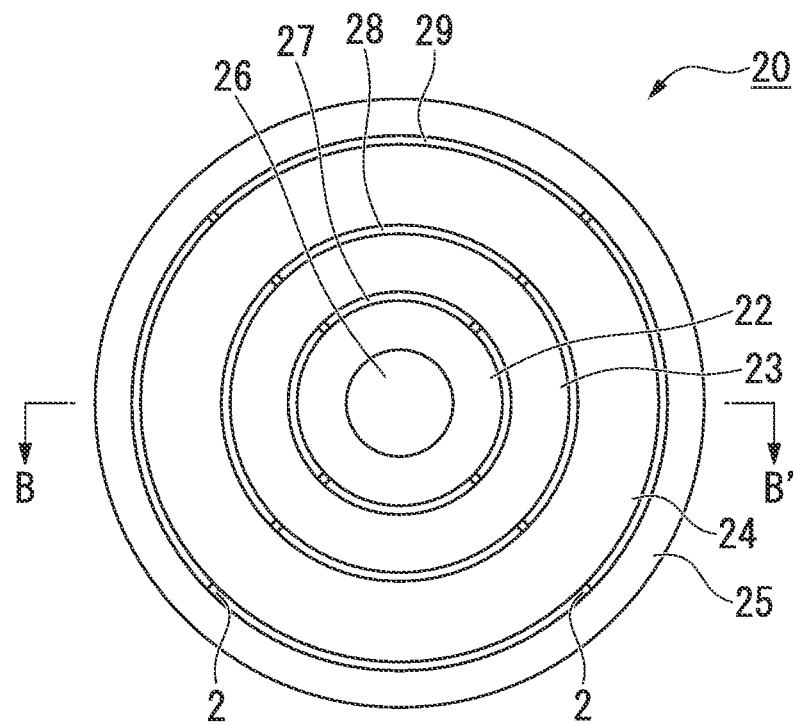
[FIG. 4A] A schematic plan view of the shield member of the second embodiment of the present invention.
Figure 4B:
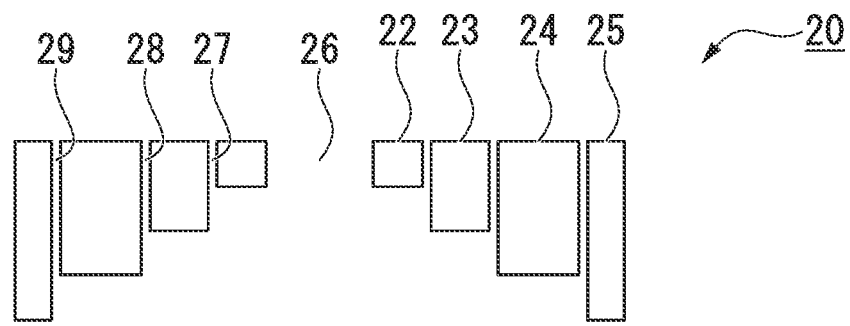
[FIG. 4B] A schematic cross-sectional view of the shield member of the second embodiment of the present invention.

In FIG. 4A, a schematic plan view of the shield member of the second embodiment of the present invention is shown, and in FIG. 4B, a schematic cross-sectional view taken along the line B-B' is shown.

Compared with the shield member of the first embodiment, the shield member 20 of the second embodiment is identical in that the shield member is configured so as to be thicker, as displaced from the center to the outer periphery, and is configured such that the heat capacity becomes larger as displacing from the center to the outer periphery. However, the shield member 20 differs in the absence of the ring member at the center. In the shield member 10, each of the gaps 27, 28 and 29 between the adjoining ring members and the opening 26 having no ring member serves as the "permeation hole" through which the raw material gas passes.

EXAMPLE 2

Figure 5:
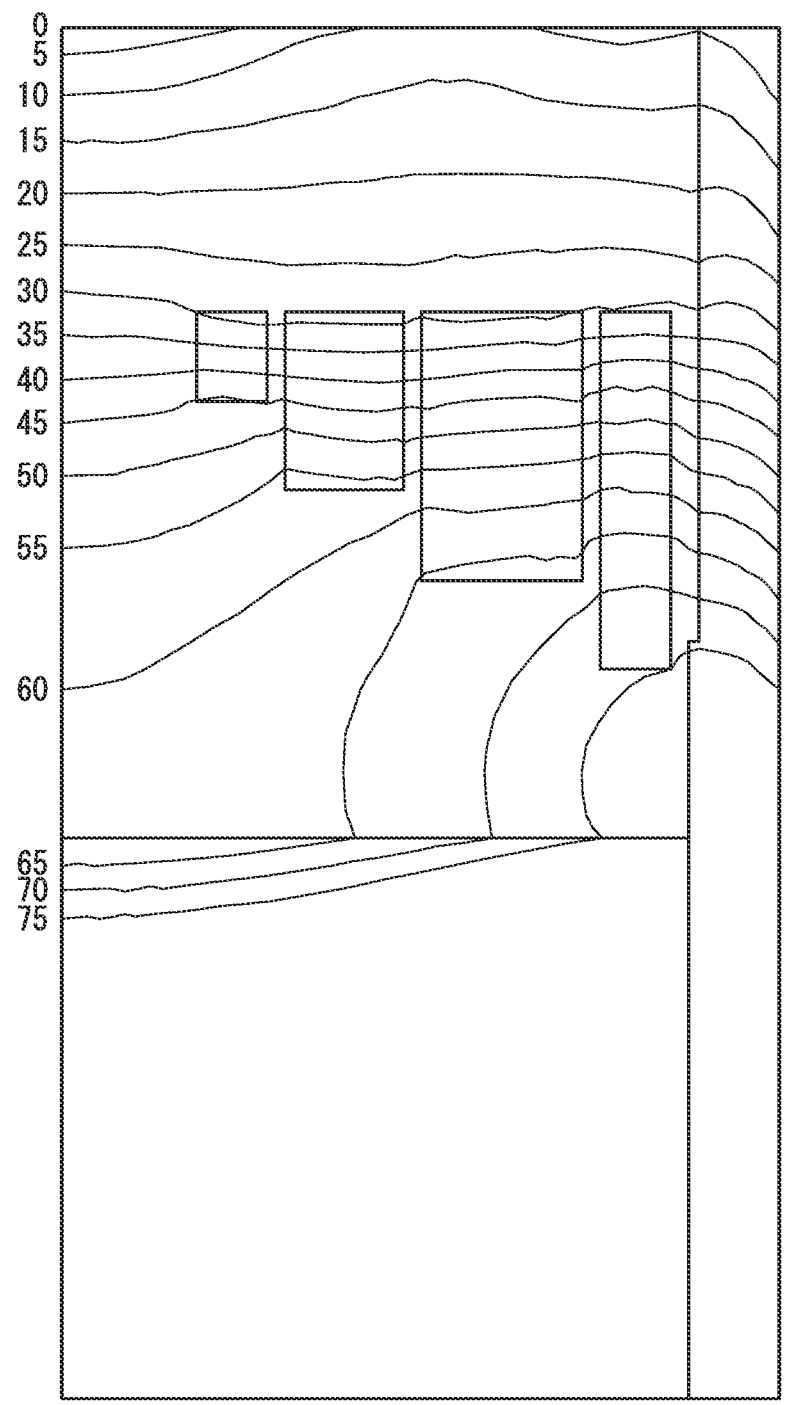
[FIG. 5] Results of simulation of temperature distribution in the vessel for growing a crystal of the apparatus for growing a single crystal using the shield member of the embodiment shown in FIGS. 4A and 4B.

FIG. 5 shows the simulation results performed similarly to the temperature distribution in the vessel for growing a crystal of the apparatus for growing a single crystal using an example ("Example 2" below) of the shield member of the embodiment shown in FIGS. 4A and 4B.

The thickness of each of the ring members 22, 23, 24 and 25, d2, d3, d4 and d5 were set to 10 mm, 20 mm, 30 mm and 40 mm, respectively. Therefore, the ratio of the maximum thickness (d5) and the minimum thickness (d2), d5/d2 is 4. The width of each of the ring members 22, 23, 24 and 25 was 8 mm, 13 mm, 18 mm and 8 mm, respectively. In addition, the distance between adjacent ring members was 2 mm.

From FIG. 5, it can be seen that the improvement effect of the temperature distribution of the surface and in the vicinity thereof of the substrate (seed crystal) is greater than that of Example 2.

In fact, as shown in FIG. 3, in the surface temperature of the substrate (seed crystal) of Example 2, the difference in the temperature between the highest temperature (periphery) and the lowest temperature (center) is 10.6° C. Hence, an improvement of 3.6° C. can be confirmed, compared with the case of the conventional shield plate being used.

[Third Embodiment]

Figure 6A:
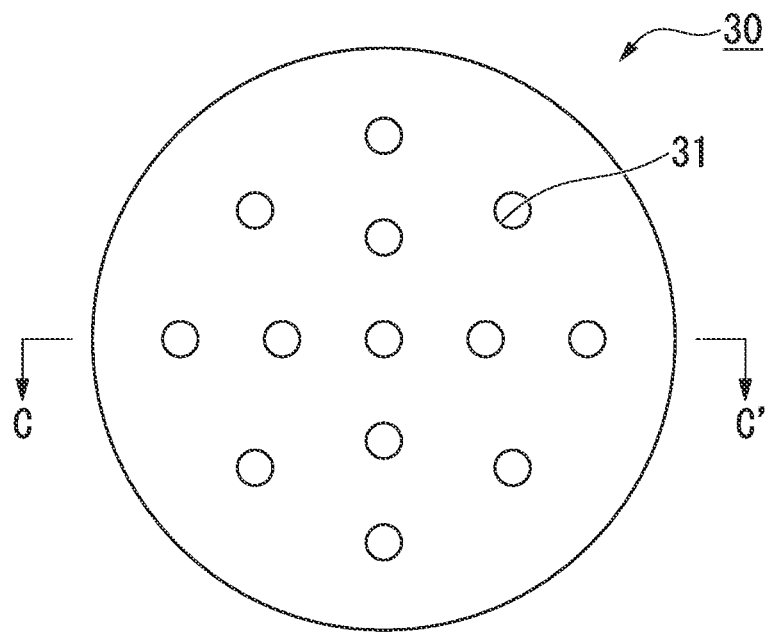
[FIG. 6A] A schematic plan view of the shield member of the third embodiment of the present invention.
Figure 6B:
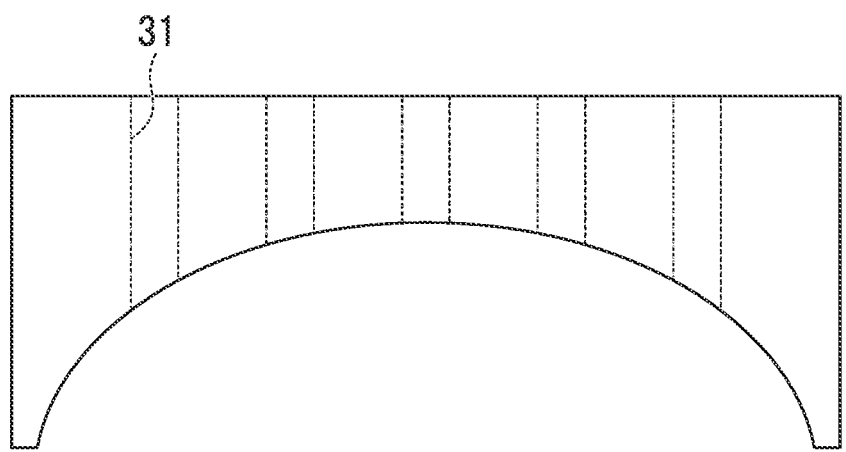
[FIG. 6B] A schematic cross-sectional view of the shield member of the third embodiment of the present invention.
Figure 7:
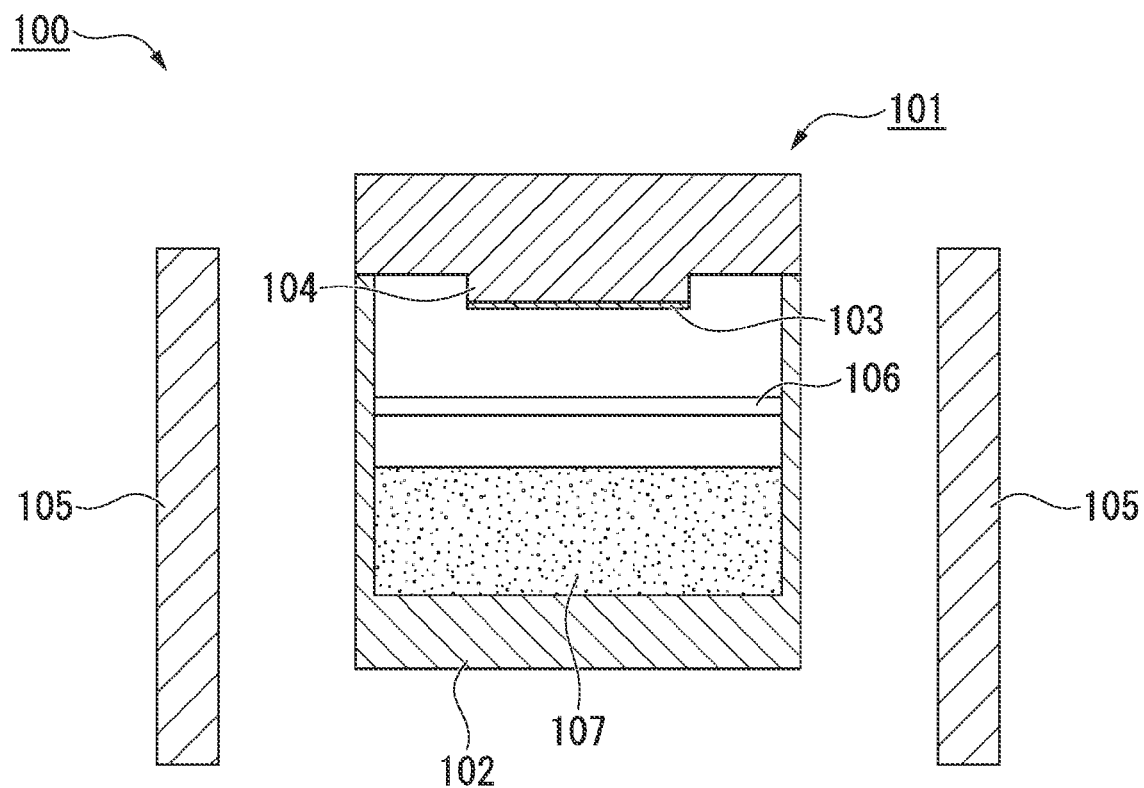
[FIG. 7] A schematic cross-sectional view showing a conventional single-crystal growing apparatus.

In FIG. 6A, a schematic plan view of the shield member of the third embodiment of the present invention is shown, and in FIG. 6B, a schematic cross-sectional view taken along the line C-C' is shown.

Compared with the shield member of the first embodiment, the shield member 30 of the third embodiment differs in that the shield member 30 consists of a single member, that the thickness varies continuously, and that the permeation hole is a circular opening 31.

INDUSTRIAL APPLICABILITY

The shield member and the apparatus for growing a single crystal equipped therewith of the present invention can be used particularly in producing a single crystal with high quality and having a large size.

DESCRIPTION OF THE SIGN

10 Shield member
11, 12, 13, 14, 15 Ring member
16, 17, 18, 19 openings (permeation holes)
20 Shield member 20
22, 23, 24, 25 Ring member
26, 27, 28, 29 Openings (permeation holes)
30 Shield member
31 Openings (permeation holes)

The invention claimed is:

1. A shield member placed between a raw material storage part and a substrate supporting part in an apparatus for growing a single crystal, the apparatus comprising: a vessel for growing the single crystal; a raw material storage part positioned at a lower portion of the vessel for growing the single crystal; a substrate supporting part, positioned above the raw material storage part so as to be opposed to the raw material storage part to support the substrate; and a heating apparatus positioned at an outer periphery of the vessel for growing the single crystal, thereby sublimating the raw material from the raw material storage part to grow the single crystal of the raw material onto the substrate, wherein a plurality of permeation holes through which the raw material gas passes is formed,
wherein the shield member consists of a plurality of ring members, individual ones of the ring members having an opening with a different inner diameter and a different specific heat capacity, and the shield member is configured such that the heat capacity thereof increases from the center toward the outer periphery by arranging the ring members with a larger specific heat capacity closer to the outer periphery.

2. The shield member as set forth in claim 1, wherein the shield member is configured so as to increase the thickness thereof as displacing from the center to the outer periphery, such that the heat capacity thereof increases as displacing from the center to the outer periphery.

3. The shield member as set forth in claim 2, wherein a ratio of the maximum thickness ($d_{max}$) and the minimum thickness ($d_{min}$) of the shield member ($d_{max}/d_{min}$) ranges from 3 to 50.

4. The shield member as set forth in claim 1. wherein the surface of the shield member on the side of the substrate supporting part is flat.

5. The shield member as set forth in claim 1, wherein the shield member has an opening ratio of center side (total area of the opening of the permeation hole/total area of the portion other than the permeation hole) which is larger than an opening ratio of peripheral edge side.

6. The shield member as set forth in claim 1 wherein each of the plurality of ring members having a different thickness and a different opening inner diameter is arranged such that thicker trig member is placed sequentially as displacing from the center to the outer periphery, so as not to overlap with each other in plan view.

7. The shield member as set forth in claim 1, wherein the shield member consists of plurality of ring members having the same thickness and a different opening inner diameter arranged to overlap each other, such that the number of ring member which is overlapping increases as displacing from the center to the outer periphery.

8. The shield member as set forth in claim 1, wherein the shield member is made of carbon material.

9. The shield member as set forth in claim 1, wherein the shield member is made of a porous material.

10. An apparatus for growing a single crystal, comprising: a vessel for growing a crystal; a raw material storage part positioned at a lower portion of the vessel for growing the single crystal; a substrate supporting part, positioned above the raw material storage part so as to be opposed to the raw material storage part to support the substrate; a shield member provided between the raw material storage part and the substrate supporting part; and a heating apparatus positioned at outer periphery of the vessel for growing the single crystal, thereby sublimating the raw material from the raw material storage part to grow the single crystal of the raw material onto the substrate,
wherein the shield member consists of a plurality of ring members, individual ones of the ring members having an opening with a different inner diameter and a different specific heat capacity, and the shield member is configured such that the heat capacity thereof increases from the center toward the outer periphery by arranging the ring members with a larger specific heat capacity closer to the outer periphery, and
the outer periphery of the shield member is supported by the inner wall of the vessel for growing crystal.

11. An apparatus for growing a single crystal, comprising: a vessel for growing a crystal; a raw material storage part positioned at a lower portion of the vessel for growing the single crystal; a substrate supporting part, positioned above the raw material storage part so as to be opposed to the raw material storage part to support the substrate; a shield member provided between the raw material storage part and the substrate supporting part; and a heating apparatus positioned at outer periphery of the vessel for growing the single crystal, thereby sublimating the raw material from the raw material storage part to grow the single crystal of the raw material onto the substrate, wherein the shield member consists of a plurality of ring members, individual ones of the ring members having an opening with a different inner diameter and a different specific heat capacity, and the shield member is configured such that the heat capacity thereof increases from the center toward the outer periphery by arranging the ring members with a larger specific heat capacity closer to the outer periphery, and the shield member is supported by a supporting member elongated from the bottom of the vessel for growing crystal.

* * * * *